United States Patent [19]

Sakamoto et al.

[11] Patent Number: 6,074,962
[45] Date of Patent: Jun. 13, 2000

[54] METHOD FOR THE FORMATION OF SILICA-BASED COATING FILM

[75] Inventors: Yoshinori Sakamoto, Kawasaki; Yoshio Hagiwara, Tokyo-to, both of Japan

[73] Assignee: Tokyo Ohka Kogyo Co., Ltd., Kawasaki, Japan

[ * ] Notice: This patent is subject to a terminal disclaimer.

[21] Appl. No.: 09/070,881

[22] Filed: May 1, 1998

[30] Foreign Application Priority Data

May 9, 1997 [JP] Japan .................................. 9-119993

[51] Int. Cl.[7] .............................. B05D 3/02; B05D 3/06; H01L 21/4763; H01L 21/31
[52] U.S. Cl. ......................... 438/790; 438/787; 438/782; 438/780; 438/778; 438/761; 438/624; 427/559; 427/558; 427/387; 427/379; 427/226
[58] Field of Search ..................................... 438/790, 789, 438/795, 799, 778, 780, 781, 782, 787, 622, 624; 427/226, 558, 541, 379, 387, 559, 595

[56] References Cited

U.S. PATENT DOCUMENTS

| | | | |
|---|---|---|---|
| 5,059,448 | 10/1991 | Chandra et al. ........................ 427/557 |
| 5,446,088 | 8/1995 | Haluska ................................... 524/588 |
| 5,496,402 | 3/1996 | Sakamoto et al. ................. 106/287.16 |
| 5,554,567 | 9/1996 | Wang ....................................... 438/624 |
| 5,614,271 | 3/1997 | Shibuya et al. ......................... 427/541 |
| 5,633,534 | 5/1997 | Kalnitsky et al. ....................... 257/752 |
| 5,762,697 | 6/1998 | Sakamoto et al. ................. 106/287.16 |

FOREIGN PATENT DOCUMENTS 0 443 760   8/1991   European Pat. Off. .

*Primary Examiner*—Charles Bowers
*Assistant Examiner*—Thanhha Pham
*Attorney, Agent, or Firm*—Wenderoth, Lind & Ponack, L.L.P.

[57] ABSTRACT

Disclosed is a method for the formation of a silica-based coating film of a relatively large thickness in the manufacturing process of semiconductor devices and liquid crystal display panels by repeating the sequence consisting of coating of the surface with a coating solution containing a partial hydrolysis-condensation product of a trialkoxy silane compound followed by drying until a desired overall thickness of the coating film is obtained prior to a final baking treatment at 350 to 500° C. The invention provides an improvement obtained by an ultraviolet irradiation treatment of the coating film intervening between a sequence of coating and drying and the next sequence of coating and drying so that the adhesion between the coating layers formed by repeating the sequence of coating and drying can be improved along with an advantage of absence of pinholes in the coating film.

10 Claims, 3 Drawing Sheets

METHOD FOR THE FORMATION OF SILICA-BASED COATING FILM

BACKGROUND OF THE INVENTION

The present invention relates to a method for the formation of a silica-based coating film on a substrate or, more particularly, to an efficient method for the formation of a silica-based coating film having a relatively large thickness, which serves as a planarizing film, interlayer insulating film, protective film, orientation film, intermediate film in the multilayered resist method and the like indispensable in the manufacture of semiconductor devices, liquid crystal display panels and the like, on the surface of a substrate, in which the silica-based coating film formed by repeating coating works exhibits good adhesion between the coating layers and is free from defects such as pinholes.

It is an established prior art that a silica-based coating film is formed on the surface of various kinds of substrate materials with an object to serve as a planarizing film, interlayer insulating film, protective film, orientation film, intermediate film in the multilayered resist method and the like indispensable in the manufacture of semiconductor devices, liquid crystal display panels and the like.

Known methods for the formation of such a silica-based coating film include the vapor phase-deposition method and the coating method by using a liquid coating composition. The former method of vapor phase deposition is a method in which silica is deposited from vapor phase onto the substrate surface to cause growing of the deposited silica layer by using a special apparatus which is necessarily very expensive. Even by setting aside the problem of expensiveness of the apparatus used therefor, the vapor phase deposition method is not very efficient and productive when applied to mass production of semiconductor devices and liquid crystal display panels.

The latter method of coating is a method in which the substrate surface is coated with a solution of a partial hydrolysis-condensation product of an alkoxy silane compound followed by drying and baking of the coating layer to cause in situ formation of silica in the form of a coating film. This method is widely practiced in the electronic industry because the efficiency of the method is very high even without using any expensive apparatuses.

The coating solution used in the coating method for the formation of a silica-based coating film is prepared, according to the disclosure in Japanese Patent Publication 63-241076, for example, by dissolving a tetra alkoxy silane or an alkyl trialkoxy silane having a lower alkyl group in an organic solvent such as an alcohol solvent and hydrolyzing the alkoxy groups of the silane compound in the solution to form a partial hydrolysis-condensation product thereof in the presence of a catalyst. The coating solution of this type is useful in the fine patterning works for the manufacture of semiconductor devices of 4 to 16 mega DRAM where the fineness of the pattern is in the submicron order, i.e. about 0.8 $\mu$m, or half-micron order, i.e. about 0.5 $\mu$m, to give practically satisfactory results.

In the current status of the electronic industry, on the other hand, mass production is now required of semiconductor devices having a still higher degree of integration than 64 mega DRAM and 1 giga DRAM so that the fineness of the photo-lithographic patterning in the manufacture of semiconductor devices to exceed pattern resolution of 0.35 $\mu$m or still finer.

From the standpoint of complying with the trend toward finer and finer pattern resolution, the silica-based coating film formed from the above mentioned coating solutions containing a partial hydrolysis-condensation product of an alkoxy silane compound has several problems in respect of adhesion to the upper layer thereon along with corrosion of the metallic circuit wiring layer resulting in short-circuiting between circuits to cause a decrease in the reliability of the semiconductor device. In addition, such a coating layer cannot completely fill up the interspace in the ultrafine patterns of 0.35 $\mu$m or finer leaving so-called "blowholes".

The inventors conducted extensive investigations to solve the above mentioned problems and previously proposed a method for the preparation of a coating solution for the formation of a silica-based coating film in the ultrafine photolithographic patterning work in which the hydrolysis reaction of an alkoxy silane is conducted extensively in a silane solution of a low concentration. This coating solution, however, is defective because the thickness of the silica-based coating film obtained by a single coating work with the coating solution can hardly exceed 100 nm so that, when a silica-based coating film of larger thickness is desired, the coating work with the coating solution followed by drying must be repeated several times. Repetition of the coating works has another problem that, if not to mention the low productivity of the coating works, the adhesion between the coating layers is not always good enough along with eventual occurrence of pinholes as a result of repellency of the surface of the underlying coating layer.

SUMMARY OF THE INVENTION

The present invention accordingly has an object, in view of the above described situations in the prior art, to provide an efficient method for the formation of a silica-based coating film of a relatively large thickness on the surface of a substrate, which exhibits excellent adhesion between the coating layers in repetition of the coating works and is free from defects such as pinholes.

Thus, the method of the present invention for the formation of a silica-based coating film on the surface of a substrate comprises the successive steps of:

(a) coating the surface of the substrate with a coating solution containing a partial hydrolysis-condensation product of a trialkoxy silane compound in an organic solvent to form a coating layer;

(b) drying the coating layer to give a dried coating film;

(c) irradiating the dried coating film with ultraviolet light in an atmosphere of an oxidizing gas so as to convert the silicon-bonded hydrogen atoms into silanolic hydroxyl groups;

(a1) coating the surface of the coating film after step (c) with a coating solution containing a partial hydrolysis-condensation product of a trialkoxy silane compound in an organic solvent to form a second coating layer;

(b1) drying the second coating layer formed in step (a1); and (d) subjecting the coating films to a baking treatment at a temperature in the range from 350 to 500° C. in an atmosphere of a non-reactive gas.

If the overall thickness of the coating film obtained by the above described steps is not large enough as desired, for example, to be 200 nm or larger, the sequence of steps (c) to (b1) is repeated as many times as desired to form a coating layer having a desired overall thickness before finally undertaking step (d).

DETAILED DESCRIPTION OF THE PREFERRED EMBODIMENTS

Figure 1:
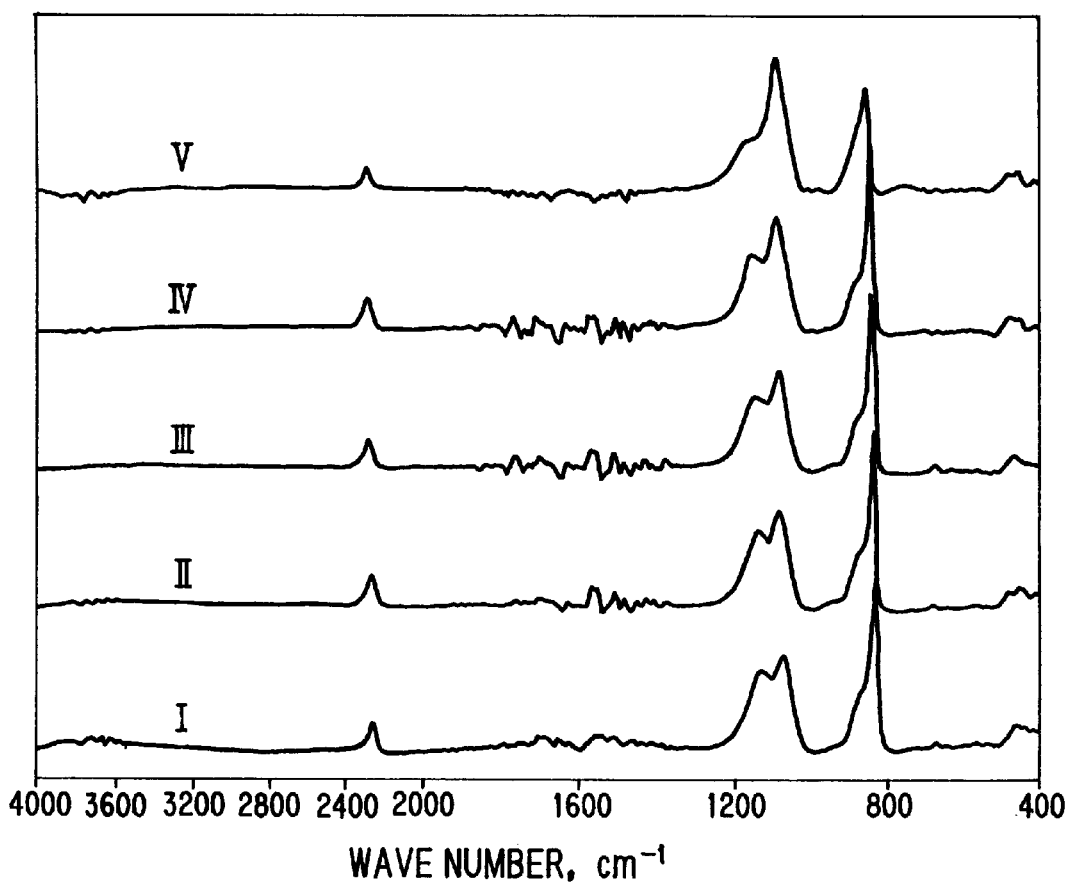
FIG. 1 shows infrared absorption spectra of the silica-based coating film at the successive stages of drying and heat treatment.

In the above described method of the present invention comprising the steps (a) to (d), the coating solution is prepared by dissolving a trialkoxy silane compound in an organic solvent and the hydrolysis reaction of the alkoxy silane compound is effected in the solution in the presence of an acid catalyst to form a partial hydrolysis-condensation product of the trialkoxy silane compound. Characteristically, the partial hydrolysis-condensation product of the trialkoxy silane compound contained in the coating solution used in the inventive method should exhibit such a behavior in the thermal analysis that a weight increase is found in the thermogravimetric analysis of the film-forming solid ingredient in the coating solution.

Japanese Patent No. 2561979 teaches a method for the formation of a silica-based coating film on the surface of a substrate, in which the substrate surface is coated with a solution containing a hydrogen silsesquioxane resin and the coating layer is irradiated with incoherent light including ultraviolet light. In this method, the coating layer of the hydrogen silsesquioxane resin is converted into a silica-based coating film by the rapid heat treatment so as to destroy the Si—H linkages and convert the same into Si—OH linkages.

As the scope of the inventive method, in contrast thereto, conversion of the Si—H linkages into Si—OH linkages is limited as far as possible to the very surface layer of the coating layer leaving the Si—H linkages in the body of the coating layer intact thereby to improve the adhesion between the coating layers and to prevent occurrence of pinholes in the silica-based coating film.

The coating solution with which the substrate surface is coated to form a silica-based coating film is a solution containing a partial hydrolysis-condensation product of a trialkoxy silane compound dissolved in an organic solvent.

Examples of the trialkoxy silane compound, of which the alkoxy groups should have 1 to 4 carbon atoms, usable in the preparation of the above mentioned coating solution include trimethoxy silane, triethoxy silane, tripropoxy silane, tributoxy silane, diethoxy monomethoxy silane, dipropoxy monomethoxy silane, dibutoxy monomethoxy silane, dipropoxy monoethoxy silane, butoxy ethoxy propoxy silane, ethoxy methoxy propoxy silane, dimethoxy monoethoxy silane, dimethoxy monopropoxy silane, diethoxy monopropoxy silane, dimethoxy monobutoxy silane and the like, of which trimethoxy silane, triethoxy silane, tripropoxy silane and tributoxy silane are preferable and trimethoxy silane and triethoxy silane are more preferable. These trialkoxy silane compounds are used either singly or as a combination of two kinds or more according to need.

The organic solvent in which the trialkoxy silane compound is hydrolyzed is, though not particularly limitative, preferably an alkyleneglycol dialkyl ether. Different from the alcoholic solvent used in the preparation of a conventional coating solution from a trialkoxy silane compound, the organic solvent of this type is advantageous because the decomposition reaction of the Si—H linkages in the starting trialkoxy silane compound and the reaction of the silanolic Si—OH groups formed by the hydrolysis of the trialkoxy silane compound back to the alkoxy groups can be suppressed to decrease the trouble due to gelation of the solution.

Examples of the alkyleneglycol dialkyl ether suitable as the solvent of the coating solution include ethyleneglycol dimethyl ether, ethyleneglycol diethyl ether, ethyleneglycol dipropyl ether, ethyleneglycol dibutyl ether, diethyleneglycol dimethyl ether, diethyleneglycol diethyl ether, diethyleneglycol dipropyl ether, diethyleneglycol dibutyl ether, propyleneglycol dimethyl ether, propyleneglycol diethyl ether, propyleneglycol dipropyl ether, propyleneglycol dibutyl ether and the like, of which dialkyl ethers of ethyleneglycol or propyleneglycol are preferable or dimethyl ethers of ethyleneglycol and propyleneglycol are more preferable. These solvents can be used either singly or as a mixture of two kinds or more according to need. The amount of the solvent used in the preparation of the coating solution is usually in the range from 10 to 30 moles per mole of the trialkoxy silane compound.

The coating solution used in the inventive method is a solution of a partial hydrolysis-condensation product of a trialkoxy silane compound dissolved in the above named organic solvent. In particular, it is preferable that the film-forming solid matter contained in the solution after removal of the solvent exhibits a unique behavior of weight increase in the thermogravimetric analysis. Characteristically, the coating solution used in the inventive method is free from the infrared absorption band in the vicinity of the wave number 3000 cm$^{-1}$ in the infrared absorption spectra. These characteristics are in contrast to the conventional coating solutions, for example, such as those disclosed in Japanese Patent Kokai 4-216827, which exhibit a behavior of weight decrease in the thermogravimetric analysis and the infrared absorption spectrum thereof has an absorption band in the vicinity of 3000 cm$^{-1}$ indicating presence of a substantial amount of residual alkoxy groups.

A preferable procedure for the preparation of the coating solution used in the inventive method is as follows.

In the first place, a trialkoxy silane compound is dissolved in the above mentioned alkyleneglycol dialkyl ether solvent in an amount in the range from 1 to 5% by weight or, preferably, from 2 to 4% by weight calculated as $SiO_2$. When the concentration of the trialkoxy silane in the thus prepared reaction mixture is too high, gelation may eventually be caused in the coating solution obtained therefrom with a decrease in the storage stability. The mechanism for this phenomenon is, though not well understood, presumably related to the fact that the hydrolysis reaction proceeds at a moderate rate when the concentration of the trialkoxy silane in the reaction mixture is low so as to prevent undue decomposition of the Si—H linkages and to facilitate formation of the so-called ladder structure of the polysiloxane.

The next step is the hydrolysis reaction of the trialkoxy silane by the addition of water to the reaction mixture. The amount of water added to the reaction mixture is in the range from 2.5 to 3.0 moles or, preferably, from 2.8 to 3.0 moles per mole of the trialkoxy silane compound in order to accomplish a high degree of the hydrolysis reaction. When the amount of water added is too small, the hydrolysis reaction cannot fully proceed so that the residual content of organic constituents in the hydrolysis product is unduly high resulting in an increase in the volume of gas evolution in the procedure for the formation of the silica-based coating film although the storage stability of the coating solution can be high enough. When the amount of water added to the reaction mixture is too large, the coating solution suffers a decrease in the storage stability.

The hydrolysis reaction of the trialkoxy silane compound in the reaction mixture is conducted in the presence of an acidic catalyst. The acidic compound as the catalyst is not particularly limitative and can be selected from conventional organic and inorganic acids used in the prior art for the preparation of silica-based coating solutions. Examples of suitable acidic compounds include acetic acid, propionic acid, butyric acid and the like as the organic acids and hydrochloric acid, nitric acid, sulfuric acid, phosphoric acid and the like as the inorganic acids, of which nitric acid is preferred.

The amount of the acid added to the reaction mixture is in the range from 1 to 200 ppm by weight or, preferably, from 1 to 40 ppm by weight. The acid is added to the reaction mixture separately or as a mixture with the water to be added for the hydrolysis reaction.

The hydrolysis reaction of the trialkoxy silane compound is conducted preferably by adding the water for hydrolysis containing the acid dropwise into the solution of the trialkoxy silane compound in an alkyleneglycol dialkyl ether kept at a temperature in the range from room temperature to 70° C. The hydrolysis reaction is complete usually within 5 to 100 hours.

Needless to say, an alcohol is produced as a by-product of the hydrolysis reaction of the trialkoxy silane. Accordingly, the reaction mixture after the hydrolysis reaction necessarily contains the alcohol as a part of the solvent, which is initially the alkyleneglycol dialkyl ether alone, for the hydrolysis product of the trialkoxy silane compound. It is important that the alcohol in the reaction mixture is removed as completely as possible not to exceed 15% by weight or, desirably, not to exceed 8% by weight in the coating solution used in the inventive method. Removal of the alcohol from the reaction mixture is performed by distillation under reduced pressure in the range from 30 to 300 mmHg or, preferably, from 50 to 200 mmHg at a temperature of 20 to 50° C. taking 2 to 6 hours. When the residual content of the alcohol is too high in the coating solution, the Si—H linkages react with the alcohol to regenerate alkoxy groups resulting in an increase in the gas evolution in the course of the procedure for the formation of the silica-based coating film and a decrease in the crack-forming limit.

In step (a) of the inventive method, the surface of a substrate material is coated with the coating solution prepared in the above described manner. The substrate material to which the inventive method is applied is not particularly limitative provided that the silica-based coating film is formed by the inventive method to serve as an inter-layer insulating film on a silicon wafer having a metallic circuit wiring layer of aluminum, as an interlayer planarizing film on a silicon wafer having a metallic circuit wiring layer and an interlayer insulating layer further thereon formed by the plasma CVD method, as an intermediate film on the underlying resist layer in the multilayer resist method, as a phase-shifter film on a glass plate having a chromium layer, as a protective film or orientation film on a glass plate having a light-transmitting electroconductive layer of ITO (indium tin oxide) and so on.

The method for the coating work is not particularly limitative and can be conventional including the methods of spray coating, spin coating, dip coating, roller coating and the like but the most conventional method in the manufacture of semiconductor devices is the spin coating method.

In step (b) of the inventive method, the coating layer formed in step (a) is subjected to drying by heating to evaporate the solvent from the coating layer to form a solid coating film on the substrate surface. The procedure for drying is not particularly limitative with respect to the heating means, temperature and length of time but, as a typical procedure, the substrate material coated with the coating solution is heated in air or in an atmosphere of non-reactive gas such as nitrogen on a hot plate kept at a temperature of 80 to 300° C. for 1 to 6 minutes. It is preferable that the heating treatment for drying of the coating layer is conducted with stepwise elevation of the temperature in at least three steps or, preferably, in three to six steps. For example, the heat treatment is conducted first at 80 to 120° C. for 30 seconds to 2 minutes, then at 130 to 220° C. for 30 seconds to 2 minutes and finally at 230 to 300° C. for 30 seconds to 2 minutes. The thus dried solid coating film on the substrate surface has a uniform and smooth surface.

In step (c) of the inventive method, the coating film thus dried on the substrate surface is irradiated with ultraviolet light in an atmosphere of an oxidizing gas such as atmospheric air. The ultraviolet light should have a wavelength in the range from 10 to 400 nm or, preferably, in the deep ultraviolet region in the wavelength range of 180 to 260 nm. The ultraviolet irradiation of the coating film is conducted for 10 seconds to 3 minutes or, preferably, from 30 seconds to 1 minute to give an irradiation dose of 20 to 2000 $mJ/cm^2$ or, preferably, 500 to 1500 $mJ/cm^2$.

The temperature of the substrate during the ultraviolet irradiation treatment in step (c) is preferably kept in the range from room temperature to 250° C. although the temperature has little influences on the formation of pinholes in the silica-based coating film. When the temperature is too high, the Si—H linkages in the coating film are destroyed and converted into siloxane linkages. Namely, the substrate subjected to the drying treatment in step (b) on a hot plate can be in situ subjected in step (c) to the ultraviolet irradiation provided that the temperature is not too high although it is optional that the substrate after the drying treatment is removed from the hot place to be cooled down to room temperature before the ultraviolet irradiation.

The ultraviolet irradiation in step (c) of the inventive method has an effect to convert the Si—H linkages in the very surface layer of the dried coating film into silanol groups Si—OH exhibiting an effect of improving the adhesion of the coating film to the overcoating layer.

The above mentioned ultraviolet irradiation, i.e. step (c), is followed by a second coating treatment in step (a1) with a coating solution which can be the same as in the first coating in step (a), to form a second coating layer followed by a second drying treatment in step (b1).

If the thickness of the coating film after the above described steps (a) to (b1) is not large enough for the purpose, the sequence including the steps (c) to (b1) is repeated at least once or as many times as necessary until the coating film has a thickness as large as desired before finally undertaking step (d). Namely, a second coating layer of the coating solution is formed by the second coating work in step (a1) on the coating film formed by the ultraviolet irradiation in step (c) so that good adhesion can be obtained between the coating layer formed by the first coating and drying and the coating layer formed by the second coating and drying.

The last step, i.e. step (d), of the inventive method is a heating treatment of the coating film on the substrate surface formed by the steps (a) to (b1) or by two or more times repetition of the sequence consisting of the steps (c) to (b1).

The heat treatment is conducted in an atmosphere of a non-reactive gas such as nitrogen at a temperature in the range from 350 to 500° C. for 10 to 90 minutes to give a uniform and dense silica-based coating film. When the temperature of the heat treatment is too low or the heating time is too short, the coating film cannot be dense enough while, when the temperature is too high or the heating time is too long, the Si—H linkages are destroyed so that the coating film also cannot be dense.

The silica-based coating film obtained by the above described procedure may have a thickness of 200 nm or larger and the thickness can exceed even 800 nm required for a special purpose.

The overall thickness of the thus finished silica-based coating film is determined by the solid concentration of the coating solution and the coating method as well as the number of repetition of the sequence consisting of steps (c) to (b1) before the final step (d). Although the thickness of the coating film can be increased as large as desired by many times repetition of the sequence consisting of steps (c) to (b1), a large times repetition of the sequence is naturally undesirable from the standpoint of obtaining a good throughput of the products so that it is preferable to employ a coating solution and a coating procedure by which a thickness as large as possible can be accomplished by undertaking a single repetition of the sequence of the steps (c) to (b1) followed by step (d).

When the method of the present invention is performed adequately according to the above described manner, a pinhole-free silica-based coating film having a large thickness of 200 nm or larger and exhibiting excellent adhesion between coating layers can be obtained with high efficiency.

The silica-based coating film obtained by the inventive method is useful as an interlayer insulating film on the metallic circuit wiring layer of aluminum provided on a silicon wafer, as a planarizing layer on the interlayer insulating layer formed by the plasma CVD method on the metallic circuit wiring layer, as an intermediate film in the multilayer resist method between the lower and upper resist layers, as a protective film on the light-transmitting electro-conductive film of ITO and the like provided on a glass plate in the manufacture of liquid crystal display panels, as an orientation film formed to improve orientation of liquid crystals, and so on.

In the following, the method of the present invention is described in more detail by way of Examples and Comparative Examples as preceded by a description of the procedure for the preparation of the coating solutions used in the Examples and Comparative Examples.

Preparation 1.

A reaction mixture was prepared by dissolving, under agitation, 73.9 g (0.45 mole) of triethoxy silane in 802.0 g (9.0 moles) of ethyleneglycol dimethyl ether corresponding to a concentration of 3% by weight calculated as $SiO_2$ and, into this reaction mixture, 24.3 g (1.35 mole) of water acidified with 5 ppm by weight of concentrated nitric acid were added dropwise under gentle agitation. After further continued agitation for about 3 hours, the reaction mixture was kept standing for 6 days at room temperature.

The reaction mixture was then subjected to distillation under reduced pressure of 120 to 140 mmHg at 40° C. for 1 hour to give a coating solution which contained 8% by weight of non-volatile matter and 1% by weight of ethyl alcohol.

Figure 2:
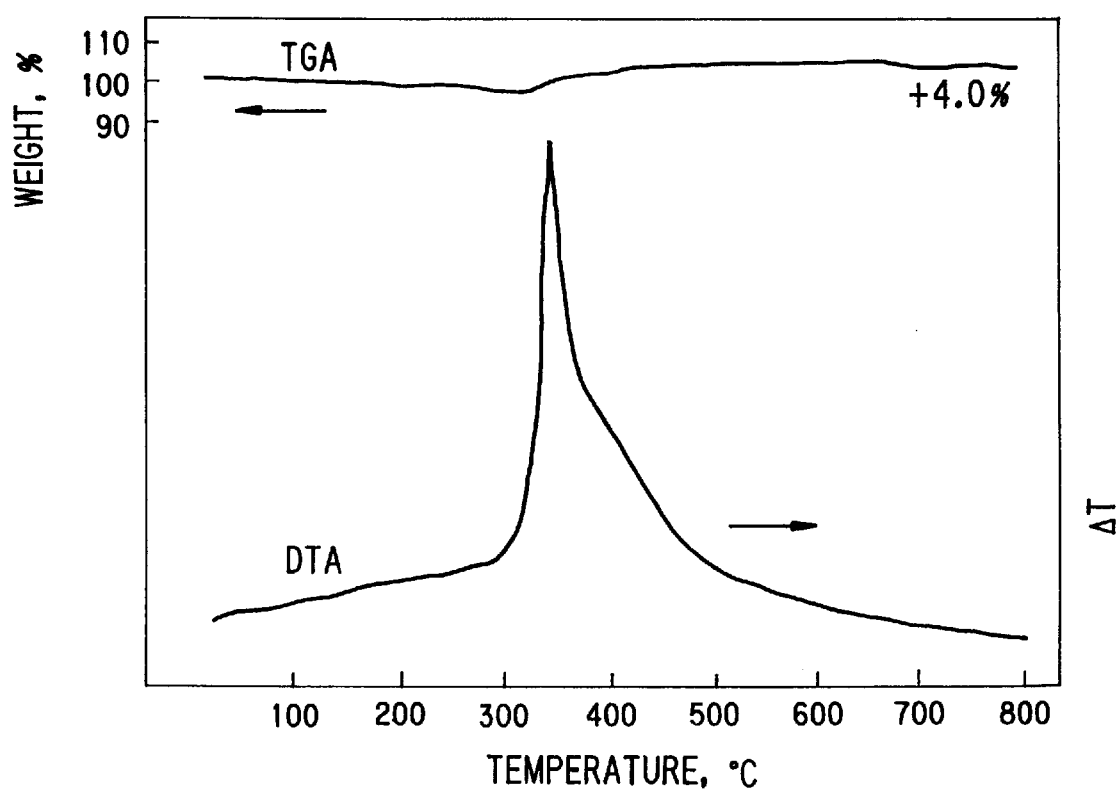
FIG. 2 is a graph showing the DTA curve and TGA curve of the solid material obtained from the coating solution prepared in Reference Example 1.

A portion of the thus obtained coating solution was dried up by heating at 140° C. for 60 minutes in a drying oven and the solid material obtained there was pulverized into a powder which was subjected to the thermal analysis in a platinum bucket of the apparatus at a rate of temperature elevation of 10° C. /minute to record the curves of the thermogravimetric analysis (TGA) and differential thermal analysis (DTA) shown by the respective curves in FIG. 2. As is clear from the TGA curve, an increase was noted in the weight of the sample starting at about 360° C. and the overall weight increase after reaching 800° C. was about 4.0%.

Preparation 2

Following the procedure described in Example 9 of Japanese Patent Kokai 4-216827, a reaction mixture was prepared by mixing 4.0 g (0.024 mole) of triethoxy silane, 12.2 g of isopropyl alcohol, 4.0 g of n-butyl alcohol and 0.33 g (0.018 mole) of water containing a drop of a 5% hydrochloric acid solution. The solution was heated to a temperature of 60 to 75° C. and kept at the same temperature for 30 minutes under agitation followed by cooling to give a second coating solution.

Figure 3:
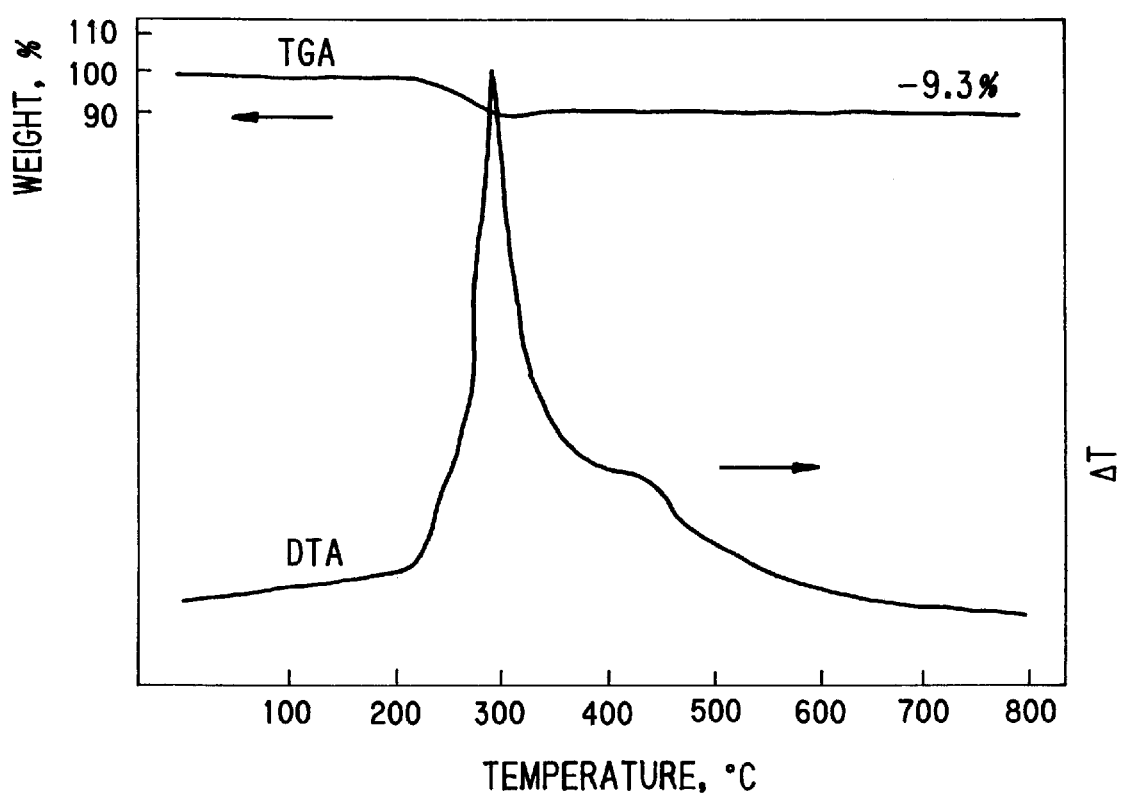
FIG. 3 is a graph showing the DTA curve and TGA curve of the solid material obtained from the coating solution prepared in Reference Example 2.

Thermal analysis of the solid material contained in the thus prepared coating solution was undertaken in the same manner as in Preparation 1 described above to give the results shown by the TGA and DTA curves in FIG. 3, which indicated a decrease in the weight of the sample of about 9.3% after reaching 800° C.

EXAMPLE 1

Using a semiconductor silicon wafer provided with a metallic circuit wiring layer of aluminum and thereon with an insulating layer of silica formed by the CVD method with tetraethoxy silane as the reactant gas to have a pattern-wise stepped level difference of 1.0 μm height on the surface as the substrate, the coating solution prepared in Preparation 1 was applied uniformly onto the substrate surface on a spinner rotating at 2000 rpm for 10 seconds followed by heating on a hot plate with stepwise elevation of the temperature first at 100° C. for 1 minute, then at 200° C. for 1 minute and finally at 300° C. for 1 minute to give a dried coating film having a thickness of 180 nm.

The infrared absorption spectrum of the coating film on the substrate surface was taken before the heat treatment, after the 100° C. heating, after the 200° C. heating and after the 300° C. heating in the above mentioned stepwise heat treatment to give the spectra I, II, III and IV, respectively, shown in FIG. 1. As is clear from these spectra, strong absorption bands assignable to the Si—H linkages appeared in the vicinity of the wave numbers of 840 $cm^{-1}$ and 2250 $cm^{-1}$.

In the next place, the substrate having the coating film formed as above was cooled to room temperature and the coating film on the substrate surface was irradiated in air for 1 minute with ultraviolet light containing deep ultraviolet light of 185 to 254 nm wavelength emitted from an ultraviolet irradiation unit (Deep UV Processor, manufactured by Nippon Denchi Co.) to give an irradiation dose of 1200 $mJ/cm^2$.

Thereafter, the same coating solution as used above was again applied to the coating film obtained in the first coating followed by drying and irradiation with ultraviolet light and this second coating layer was dried in the same manner as above followed by a baking treatment in an atmosphere of nitrogen gas at 450° C. for 30 minutes to obtain a silica-based coating film having an overall thickness of about 500 nm.

The coating film just before the 450° C. baking treatment was inspected on an optical microscope for the occurrence of pinholes to detect absolutely no pinholes along with good adhesion between the coating layers formed by twice repeating coating and drying. Further, the silica-based coating film after the 450° C. baking treatment was subjected to the infrared absorption spectrophotometry to give the result shown by the spectrum V in FIG. 1 which indicates absorption bands assignable to the Si—H linkages in the vicinity of 840 cm$^{-1}$ and 2250 cm$^{-1}$.

EXAMPLE 2

The procedure undertaken in Example 1 to the second coating and second drying treatments was followed by a second ultraviolet irradiation, third coating work and third drying treatment before the final 450° C. baking treatment. The thus obtained silica-based coating film had an overall thickness of 750 nm without pinholes.

Comparative Example 1

The experimental procedure was substantially the same as in Example 1 excepting for the omission of the ultraviolet irradiation of the dried coating film to obtain a silica-based coating film having an overall thickness of 500 nm, which contained pinholes as inspected on an optical microscope and was found poor in the adhesion to the substrate surface.

Comparative Example 2

The experimental procedure was substantially the same as in Example 2 excepting for the omission of the ultraviolet irradiation of the dried coating film conducted twice to obtain a silica-based coating film having an overall thickness of 750 nm, which contained pinholes as inspected on an optical microscope and was found poor in the adhesion to the substrate surface.

What is claimed is:

1. A method for the formation of a silica-based coating film on the surface of a substrate which comprises the successive steps of:

(a) coating the surface of the substrate with a coating solution containing a partial hydrolysis-condensation product of a trialkoxy silane compound in an organic solvent to form a coating layer;

(b) drying the coating layer to give a dried coating film;

(c) irradiating the dried coating film on the substrate surface with ultraviolet light in an atmosphere of an oxidizing gas;

(a1) coating the surface of the coating film after step (c) with a coating solution containing a partial hydrolysis-condensation product of a trialkoxy silane compound in an organic solvent to form a second coating layer;

(b1) drying the second coating layer formed in step (a1) to give a second dried coating film; and (d) subjecting the dried coating films to a baking treatment at a temperature in the range from 350 to 500° C. in an atmosphere of a non-reactive gas.

2. The method for the formation of a silica-based coating film on the surface of a substrate as claimed in claim 1 which further comprises at least once of the sequence consisting of steps (c), (a1) and (b1) repeated prior to step (d).

3. The method for the formation of a silica-based coating film on the surface of a substrate as claimed in claim 1 in which the trialkoxy silane is trimethoxy silane or triethoxy silane.

4. The method for the formation of a silica-based coating film on the surface of a substrate as claimed in claim 1 in which the organic solvent in the coating solution is an alkyleneglycol dialkyl ether.

5. The method for the formation of a silica-based coating film on the surface of a substrate as claimed in claim 1 in which the coating solution contains an alcohol in an amount not exceeding 15% by weight.

6. The method for the formation of a silica-based coating film on the surface of a substrate as claimed in claim 1 in which the drying in steps (b) and (b1) is performed at a temperature not higher than 300° C.

7. The method for the formation of a silica-based coating film on the surface of a substrate as claimed in claim 1 in which the ultraviolet light used in step (c) contains deep ultraviolet light having a wavelength in the range from 180 to 260 nm.

8. The method for the formation of a silica-based coating film on the surface of a substrate as claimed in claim 1 in which the temperature of the substrate in step (c) is not higher than 250° C.

9. The method for the formation of a silica-based coating film on the surface of a substrate as claimed in claim 1 in which the ultraviolet irradiation in step (c) is performed to give an irradiation dose in the range from 20 to 2000 mJ/cm$^2$.

10. The method for the formation of a silica-based coating film on the surface of a substrate as claimed in claim 1 in which the baking treatment in step (d) is performed for a length of time in the range from 10 to 90 minutes.

* * * * *